(12) United States Patent
Yeo et al.

(10) Patent No.: US 12,063,739 B2
(45) Date of Patent: Aug. 13, 2024

(54) PRINTED CIRCUIT BOARD AND FABRICATION THEREOF

(71) Applicant: Delphi Technologies IP Limited, St. Michael (BB)

(72) Inventors: Kok Wee Yeo, Singapore (SG); Wai Kwan Wong, Kokomo, IN (US); Andreas Aye, Strassen (LU)

(73) Assignee: Delphi Technologies IP Limited, St. Michael (BB)

( * ) Notice: Subject to any disclaimer, the term of this patent is extended or adjusted under 35 U.S.C. 154(b) by 275 days.

(21) Appl. No.: 17/765,773

(22) PCT Filed: Dec. 7, 2020

(86) PCT No.: PCT/EP2020/084861
§ 371 (c)(1),
(2) Date: Mar. 31, 2022

(87) PCT Pub. No.: WO2021/144067
PCT Pub. Date: Jul. 22, 2021

(65) Prior Publication Data
US 2022/0377889 A1   Nov. 24, 2022

(30) Foreign Application Priority Data
Jan. 13, 2020   (SG) .............. 10202000300P

(51) Int. Cl.
*H05K 1/11* (2006.01)
*H05K 3/00* (2006.01)
*H05K 3/32* (2006.01)

(52) U.S. Cl.
CPC ............. *H05K 1/11* (2013.01); *H05K 3/0011* (2013.01); *H05K 3/32* (2013.01); *H05K 2201/09045* (2013.01)

(58) Field of Classification Search
CPC .......... H05K 1/11; H05K 2201/09045; H05K 2201/09909; H05K 2201/2036;
(Continued)

(56) References Cited

U.S. PATENT DOCUMENTS

| | | |
|---|---|---|
| 5,194,137 A | 3/1993 | Moore et al. |
| 5,315,070 A | 5/1994 | Maiwald |

(Continued)

FOREIGN PATENT DOCUMENTS

| | | |
|---|---|---|
| CN | 101754592 A | 6/2010 |
| GB | 2149581 A | 6/1985 |
| JP | 2015130424 A | 7/2015 |

OTHER PUBLICATIONS

International Search Report and Written Opinion issued on Feb. 26, 2021 in counterpart International Patent Application No. PCT/EP2020/084861 (11 pages, in English).

(Continued)

*Primary Examiner* — Timothy J Thompson
*Assistant Examiner* — Guillermo J Egoavil
(74) *Attorney, Agent, or Firm* — Joshua M. Haines; Bookoff McAndrews, PLLC

(57) ABSTRACT

A printed circuit board (PCB) (4) including an upper surface having one or more electrical terminals (9) thereon, said terminal adapted for connection to corresponding terminal of one or more electrical components, and further including one or more platforms (10) fabricated thereon, said platforms being located adjacent to corresponding component terminals, said platforms being adapted to support an electrical component thereupon, such that a portion of the component overhangs said platform above said corresponding PCB terminal.

7 Claims, 2 Drawing Sheets

(58) Field of Classification Search
CPC ......... H05K 2203/0588; H05K 3/0011; H05K 3/303; H05K 3/32; H05K 3/3436; H05K 3/3452; H05K 3/00; Y02P 70/50
USPC ........................................................ 174/261
See application file for complete search history.

(56) References Cited

U.S. PATENT DOCUMENTS

| | | | |
|---|---|---|---|
| 7,118,940 | B1 | 10/2006 | Myers et al. |
| 8,149,082 | B2 | 4/2012 | Hirasawa et al. |
| 2002/0006033 | A1 | 1/2002 | Chengalva |
| 2007/0007323 | A1* | 1/2007 | Russell .................. H05K 3/303 228/246 |
| 2008/0198566 | A1 | 8/2008 | Minota et al. |
| 2012/0161191 | A1* | 6/2012 | Cheng ................... H01L 33/486 257/E33.062 |
| 2018/0108622 | A1* | 4/2018 | Ahrens ............... H01L 21/6835 |

OTHER PUBLICATIONS

Singapore Written Opinion issued on Jan. 28, 2022 in counterpart Singaporean Patent Application No. 10202000300P (7 pages, in English).
Office Action in Chinese Application 20208071660, dated Jul. 5, 2023 (18 pages).

\* cited by examiner

PRINTED CIRCUIT BOARD AND FABRICATION THEREOF

CROSS-REFERENCE TO RELATED APPLICATION(S)

This patent application is a National Stage of and claims the benefit of priority to International Patent Application No. PCT/EP2020/084861, filed on Dec. 7, 2020, which claims the benefit of priority to Singapore Patent Application No. 10202000300P, filed on Jan. 13, 2020, the entirety of which is incorporated herein by reference.

TECHNICAL FIELD

This invention relates to circuit boards such as Printed Circuits Boards (PCBs) and relates to improved circuit board design and fabrication process which allows and provides for improved interconnection reliability of components to/on such PCBs.

BACKGROUND OF THE INVENTION

As miniaturization and power demand increases, there is a need for improved discrete component interconnection reliability. Discrete component reliability enhancement solutions are usually provided by component supplier. Such reliability enhancement part comes with extra cost.

A problem with connecting discrete components such as resistors, transistors, and chips to PCBs, is that they are usually connected using soldering methods. A problem is that often the layer of solder connecting the component to the PCB is thin, resulting in thermal and mechanical stresses and a risk of detachment.

Based on a common solder fatigue model such as the Engelmaier model, it is known that a higher solder height, i.e. larger thickness of the solder layer between PCB and component will improve reliability.

Known techniques to improved solder joint reliability involve adapting the design of the component itself. However, such solutions are complex in that the components have often to be individually designed for this. The requires the support of manufacturers of discrete component supplier. Hence form a commercial point of view in addition part pricing is controlled by supplier and EOL (End of Line) is controlled by supplier.

It is an objective of the invention to provide improved reliability without such problems.

SUMMARY OF THE INVENTION

In one aspect is provided A printed circuit board (PCB) including an upper surface having one or electrical terminals thereon, said terminal adapted for connection to corresponding terminal of one or more electrical components, and further including one or more platforms fabricated thereon, said platforms being located adjacent to corresponding component terminals, said platforms being adapted to support an electrical component thereupon, such that a portion of the component overhangs said platform above said corresponding PCB terminal.

Said PCB may include substrate and a masking layer formed thereon, said platforms being fabricated on said masking layer.

The underside of the overhang portion may have a corresponding electrical terminal to said PCB terminal.

The PCB may include one or more components attached to the PCB, via location on respective platform(s), such that the platforms are sandwiched between said component and said PCB, and a solder layer is provided between underside of the overhang and the PCB surface, so connecting the PCB terminal and corresponding component terminal.

In a further aspect is provided a PCB having one or more electrical terminals located on an upper surface thereof, and including one or more component platforms fabricated thereon, said platforms being located adjacent to one or more electrical terminals, and further including one or more components located on said corresponding platforms such that a portion of said component overhangs said platform, and wherein the underside of the overhang portion of the component includes an component electrical terminal, and is positioned substantially above said corresponding PCB electrical terminal.

The PCB may include a solder layer provided between underside of the overhang and the PCB surface, so connecting the PCB terminal and corresponding component terminal.

The PCB may include a substrate and a masking layer layered thereon said platforms being provided on said masking layer.

Said platform may be substantially flat and planar.

The PCB may have said platform thickness is between 0 and 1 mm.

In a further aspect is provided a method of fabricating a PCB comprising:
a) providing a substrate having one or more PCB electrical terminals fabricated on the upper surface thereof adapted for electrical connection to corresponding terminals on components;
b) fabricating one or more platforms onto said PCB upper surface, adjacent to one or more PCB electrical terminals;
c) adding one or more components onto corresponding platforms, such that a portion of said component overhangs said platform above a corresponding PCB electrical terminal, said overhang portion including a component electrical terminal on its underside;
d) forming a solder or weld connection between said PCB electrical terminal and corresponding component terminal.

In step c) the component terminal may lie substantially above said corresponding PCB terminal.

BRIEF DESCRIPTION OF THE DRAWINGS

The present invention is now described by way of example with reference to the accompanying drawings in which.

DESCRIPTION OF THE PREFERRED EMBODIMENTS

Known techniques to improved solder joint reliability involve adapting the design of the component itself. In known examples protrusions such as bumps on the undersides of the components provides spacing when the component is attached to the PCB and raises the component (i.e.

spaces it) from the PCB to allow more room for solder, hence increasing welding thickness However, such solutions are complex in that the components have often to be individually designed for this.

Problems with this are as mentioned above; it requires the manufacturer of the component to redesign or specially design the component. Most customers will take component suppliers' solution and pay the price required to have the enhancement needed Invention In examples, a substrate (e.g. PCB base) and/or fabrication process is provided where raised features/areas/platforms are provided on the PCB, i.e. added thereto e.g. like solder mask layer. Subsequently the components are attached to the PCB via said raised areas, i.e. on top on said raised areas, such that the raised areas are sandwiched between component and upper surface of the PCB substrate/board. The raised areas/platforms thus space the component from the PCB, and provide increase spacing between overhangs areas of the component and upper PCB surface to allow a thicker layer of solder between connection on the surface of the PCB and component terminals thus improve discrete component solder joint reliability.

The features provided may be raised platforms or pads, e.g. produced in the PCB fabrications process, which provide extra spacing for increased solder thickness when component are attached i.e. added to the PCB. These platforms or pads may be generally flat (i.e. have dimension of width or length that are substantially larger than their thickness) and may be planar. The platforms/features are so shaped and dimensioned such that when components are added i.e. placed of top thereof, there is an overlap or overhang of a portion of the component, creating a gap between the underside of the overhang portion of the component and the top surface of the PCB. So in this way those portions of the underside of the component with the component terminals (which need soldering to the PCB) overhang the features thus providing gap between the terminal and the PCB for adequate solder thickness. The platforms are so positioned and dimensioned that the when the component is placed onto the platforms a terminal of the component is on the underside of a overhang position and this lies above the corresponding terminal on the PCB i.e the two terminals are aligned vertically with each other and the air gap between can be filled with solder for the connection therebetween.

Figure 1A:
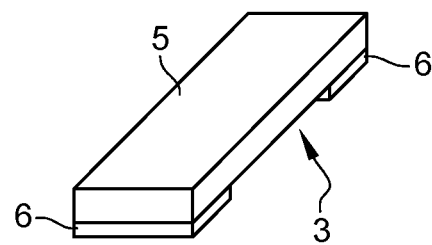
FIG. 1a and FIG. 1b shows an example of the invention.
Figure 1B:
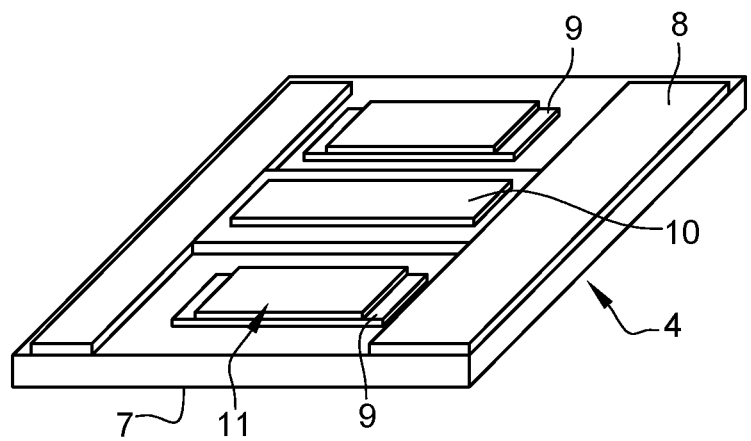

This provides increased increasing solder height, and this improves discrete component reliability improvement solution whilst requiring no change to the components. FEM modelling of a discrete part further shows the improvement that the solder height helps in reducing creep strain FIG. 1a and FIG. 1b shows an example of the invention. FIG. 1a shows a standard discrete component 3 which is to be connected to a PCB designated generally as 4, shown in FIG. 1b. The component may be a resistor, transistor, diode, chip or such like. The component may have a main portion 5 and includes electrical connection terminals 6, fabricated from electrically conductive material, and are usually on the underside of the component.

The PCB according to one example may have a main substrate 7, onto which may be provided a primary mask layer 8. This may be added according to the design layout of the finished PCB. Connections of the component terminals may be to electrical pads such as copper pads 9 formed on the PCB before the component is added. According to examples of the invention raised feature or areas 10 which can be regarded as platforms/pads are provided. These may be planar and flat, these may be provided on top of the primary or other mask layers or PCB main substrate.

The FIG. 1b shows also how a solder layer 11 is subsequently provided on the copper pads when the component is attached. Of course the fabricated PCB of FIG. 1a will usually be supplied without the solder layer.

Figure 2:
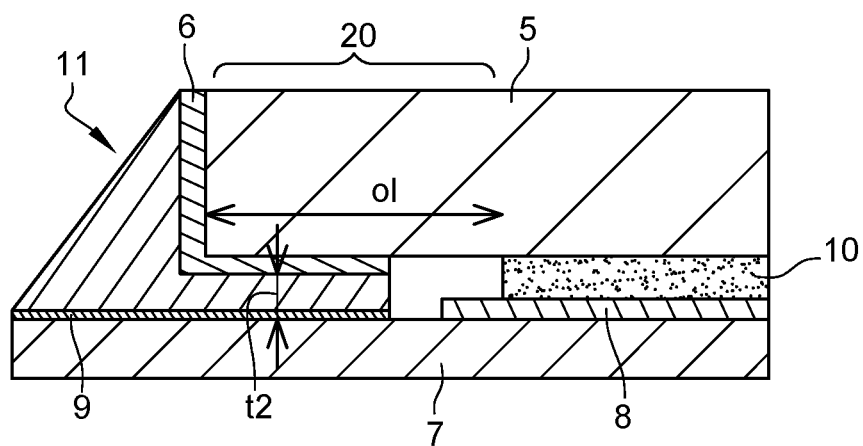
FIG. 2 show a cross-sectional side view of the (subsequent) connection of the component of FIG. 1a to the PCB of FIG. 1b.

FIG. 2 show a cross-sectional side view of the (subsequent) connection of the component 3 to the PCB of FIG. 1b (e.g. in the finished PCB product). As can be seen, the platform 10 allows the component to be raised from the main portion of the PCB i.e. the substrate 7/primary mask layer 8. There is an overhang portion 20 of the component which overhangs the platform 10. This allows for a gap to be provided between the electrical terminal 6 of the component which is aligned with the corresponding electrical terminal on the PCB thus providing an air gap for substantially thick layer of solder 11 of thickness t2 to be provided for the electrical interconnection of the component to the board (via here the terminal and the copper pad).

As can be seen the portion of the underside of the component with the electrical connection terminals overlaps/overhangs the platform 10 to provide an overlap distance o1. In examples, the platform 10 may have a length or width in one or more directions which is smaller than the corresponding length or width the component when the component is fabricated onto the PCB. In other words the pad 10 is shaped and positioned such that the underside regions of the component with the electrical terminals overlap the pads/platforms above the corresponding terminals on the PCB board to provide the thickness t2

Figure 3:
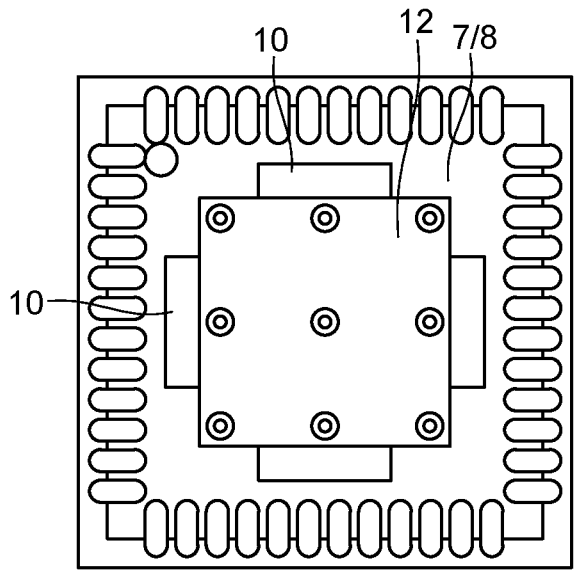
FIG. 3 shows a further embodiment.

FIG. 3 shows a further embodiment where platform 10 is used to provide a raised platform for a chip 12 on a PCB. The figure show a plans view and like reference numerals designate the same components as in the previous figures The raised platforms may be any shape or size and the skilled person would be aware of designs specific for components which raise the component i.e. space the component from the PCB but to also provide an overlap region as described above to allow soldering of the terminals of the components to the electrical connections on the PCB.

Figure 4:
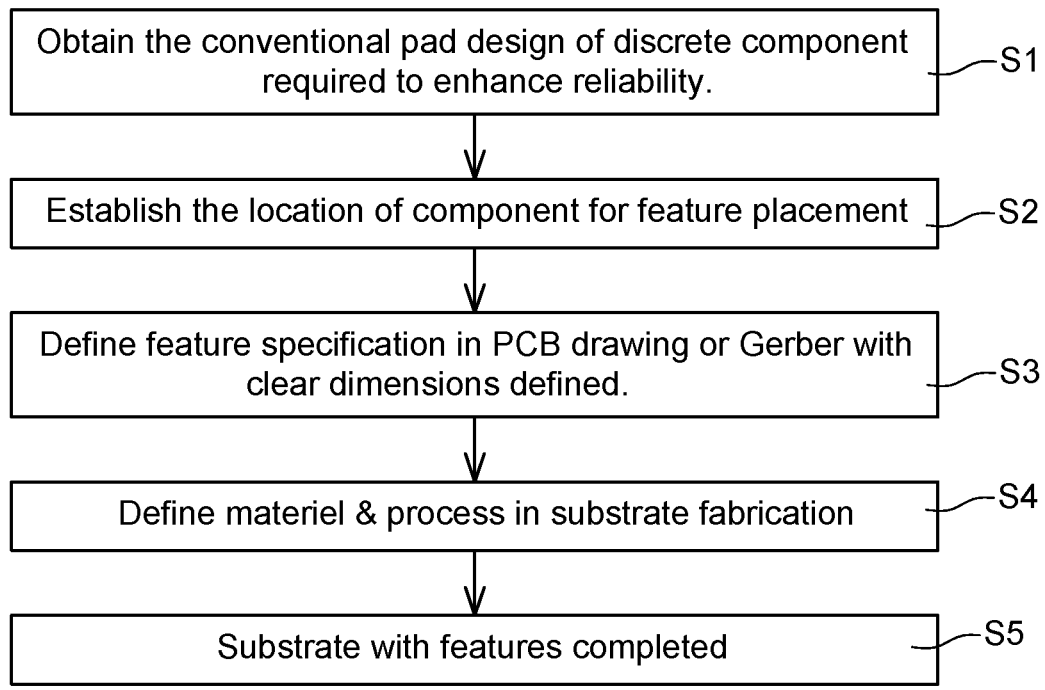
FIG. 4 shows a flow chart of an example of fabrication

FIG. 4 shows a flow chart example of the feature fabrication on the PCB. In the first step S1 the conventional pad design of discrete components is obtained. In the second step S2 the location of the component on the PCB for feature placement is established. In the next step S3 the feature specification is defined.

This may be done with a PCB layout software or Gerber tools. In the next step S4 the material and process are defined in the substrate fabrication process. In the last step S5 the substrate with features is completed for SMT common assembly process.

Discrete component supplier's need in process manufacturing is removed. A process that is common in the substrate fabrication is used to enhance interconnection reliability of a discrete part. It provides an low-cost alternate interconnection reliability solution that can be applied as standalone or addon solution

The invention claimed is:
1. A printed circuit board (PCB) including an upper surface having a PCB electrical terminal thereon, the PCB electrical terminal adapted for connection to a component terminal of an electrical component, and further including a platform fabricated thereon, the platform being located adjacent to the component terminal, the platform being adapted to support the electrical component thereupon, such that a portion of the electrical component overhangs the platform above the PCB electrical terminal,
  wherein the PCB includes a substrate and a masking layer formed thereon, the platform being fabricated on the masking layer,
  wherein the platform is in the shape of a rectangular prism having an area, when viewed from above, that is entirely within an area of the masking layer upon which the platform is fabricated, and
  wherein the PCB has three rectangular masking layers, a first masking layer and a second masking layer of which are located along two opposite ends of the PCB, covering a full length of the PCB, and a third masking layer of which is located across a middle of the PCB connecting the first masking layer and the second masking layer, and wherein the PCB has a single platform located on top of the third masking layer.

2. The PCB as claimed in claim 1 wherein the platform has a thickness up to 1 mm.

3. The PCB as claimed in claim 1 wherein the platform is adapted to support the electrical component thereupon, such that an underside of an overhang portion of the electrical component has a component terminal to the PCB electrical terminal.

4. The PCB as claimed in claim 1 including an electrical component attached to the PCB, via location on the platform, such that the platform is sandwiched between the electrical component and the PCB, and a solder layer is provided between underside of an overhang portion and a PCB surface, so connecting the PCB electrical terminal and the component terminal.

5. The PCB as claimed in claim 1 wherein the platform is substantially flat and planar.

6. A method of fabricating a PCB comprising:
  a) providing a substrate having a PCB electrical terminal fabricated on an upper surface thereof adapted for electrical connection to a component terminal on an electrical component;
  b) fabricating a platform onto the upper surface, adjacent to the PCB electrical terminal;
  c) adding the electrical component onto the platform, such that a portion of said electrical component overhangs the platform above the PCB electrical terminal, an overhang portion including the component terminal on its underside; and
  d) forming a solder or weld connection between the PCB electrical terminal and the corresponding component terminal, wherein fabricating the platform comprises fabricating the platform in a shape of a rectangular prism having an area, when viewed from above, that is entirely within an area of a masking layer upon which the platform is fabricated, wherein the PCB has three rectangular masking layers, a first masking layer and a second masking layer of which are located along two opposite ends of the PCB, covering a full length of the PCB, and a third masking layer of which is located across a middle of the PCB connecting the first masking layer and the second masking layer, and wherein the PCB has a single platform located on top of the third masking layer.

7. The method as claimed in claim 6 wherein in step c) the component terminal lies substantially above the PCB electrical terminal.

* * * * *

UNITED STATES PATENT AND TRADEMARK OFFICE
CERTIFICATE OF CORRECTION

PATENT NO. : 12,063,739 B2
APPLICATION NO. : 17/765773
DATED : August 13, 2024
INVENTOR(S) : Kok Wee Yeo et al.

It is certified that error appears in the above-identified patent and that said Letters Patent is hereby corrected as shown below:

In the Claims

Column 6, Line 15, in Claim 6, before "component" delete --corresponding--.

Signed and Sealed this
First Day of October, 2024

Katherine Kelly Vidal
*Director of the United States Patent and Trademark Office*